United States Patent
Seidel et al.

(10) Patent No.: US 12,557,570 B2
(45) Date of Patent: Feb. 17, 2026

(54) METHOD FOR PRODUCING A FERROELECTRIC LAYER OR AN ANTIFERROELECTRIC LAYER

(71) Applicant: Fraunhofer-Gesellschaft zur Förderung der Angewandten Forschung E.V., Munich (DE)

(72) Inventors: Konrad Seidel, Dresden (DE); Maximilian Lederer, Dresden (DE); Ricardo Revello, Dresden (DE); David Lehninger, Dresden (DE)

(73) Assignee: Fraunhofer-Gesellschaft zur Förderung der Forschung E.V, Munich (DE)

( * ) Notice: Subject to any disclaimer, the term of this patent is extended or adjusted under 35 U.S.C. 154(b) by 240 days.

(21) Appl. No.: 18/040,989

(22) PCT Filed: Aug. 10, 2021

(86) PCT No.: PCT/EP2021/072247
§ 371 (c)(1),
(2) Date: Feb. 8, 2023

(87) PCT Pub. No.: WO2022/034061
PCT Pub. Date: Feb. 17, 2022

(65) Prior Publication Data
US 2023/0326747 A1    Oct. 12, 2023

(30) Foreign Application Priority Data

Aug. 11, 2020 (DE) ............. 10 2020 210 163.9

(51) Int. Cl.
H10D 64/68    (2025.01)
H01L 21/02    (2006.01)
(Continued)

(52) U.S. Cl.
CPC .. *H01L 21/02356* (2013.01); *H01L 21/02181* (2013.01); *H01L 21/02189* (2013.01);
(Continued)

(58) Field of Classification Search
CPC ......... H01L 21/02356; H01L 21/02181; H01L 21/02189; H01L 21/02194; H01L 29/78391; H01L 29/516
See application file for complete search history.

(56) References Cited

U.S. PATENT DOCUMENTS

2007/0069263 A1*  3/2007  Mizuuchi ............... H10B 63/82
                                                        257/295
2010/0289377 A1* 11/2010  Erbil ...................... H10N 15/10
                                                        310/306
(Continued)

FOREIGN PATENT DOCUMENTS

CA        2971782 A1   12/2018
DE    102016201156 A1    9/2016

OTHER PUBLICATIONS

Park et al, "Study on the size effect in Hf0.5Zr0.5O2 films thinner than 8 nm before and after wake-up field cycling" Nov. 12, 2015, Applied Physics Letter 107 (Year: 2015).*
(Continued)

*Primary Examiner* — David Vu
*Assistant Examiner* — Brandon C Fox
(74) *Attorney, Agent, or Firm* — Marshall & Melhorn, LLC

(57) ABSTRACT

A method for producing a ferroelectric layer or antiferroelectric layer in which a layer of a paraelectric material already deposited on a surface of a substrate with a layer thickness of at least two crystallographic unit cells is introduced into an alternating electric field. The alternating electric field is repeatedly cycled between a positive electric
(Continued)

field strength and a negative electric field strength of amplitude greater than the coercivity field strength of the material such that the layer of paraelectric material forms a polarization.

11 Claims, 5 Drawing Sheets

(51) Int. Cl.
  *H01L 21/3105* (2006.01)
  *H10D 30/69* (2025.01)
  *H10D 1/68* (2025.01)

(52) U.S. Cl.
  CPC ......... *H01L 21/02194* (2013.01); *H10D 1/68* (2025.01); *H10D 30/701* (2025.01)

(56) References Cited

U.S. PATENT DOCUMENTS

| | | | |
|---|---|---|---|
| 2013/0022839 A1* | 1/2013 | Kijima | C23C 18/1254 252/62.9 PZ |
| 2015/0162063 A1 | 6/2015 | Mueller | |
| 2018/0337055 A1 | 11/2018 | Yamaguchi | |
| 2020/0127111 A1 | 4/2020 | Lin et al. | |

OTHER PUBLICATIONS

Ali et al, "Impact of Ferroelectro Wakeup on Reliability of Laminate based Si-doped Hafnium oxide (HSO) FeFet Memory Cells" IEEE 2020 (Year: 2020).*

German Patent and Trademark Office, German Search Report in Application No. DE 10 2020 210 163.9 dated Oct. 27, 2020, 7 pages, Munich, Germany.

European Patent Office, International Search Report and Written Opinion in Application No. PCT/EP2021/072247, dated Nov. 9, 2021, 17 pages, Rijswijk, Netherlands.

Ali T et al. "Impat of Ferroelectric Wakeup of Reliability of Laminate based Si-doped Hafnium Oxide (HSO) FeFET Memory Cells" 2020 IEEE International Reliability Physics Symposium (IRPS) IEEE, Apr. 28, 2020, pp. 1-9.

M Hoffman et al. "Stabilizing the ferroelectric phase in doped hafnium oxide" Journal of Applied Physics. Aug. 19, 2015, pp. 072006 1 through 9.

Kim Si Joon et al. "Large ferroelectric polarization of TiN/Hf0•5Zr0•502/TiN capacitors due to stress-induced crystallization at low thermal budget" Applied Physics Letters, A I P Publishing LLC, US, vol. 111, No. 24, Dec. 12, 2017, pp. 24290 1 through 5.

Park Min Hyuk et al., Study on the size effect in Hf0.5Zr0.502 films thinner than 8 nm before and after wake-up field cycling, Applied Physics Letters, A I P Publishing LLC US, vol. 107, No. 19, Nov. 9, 2015, pp. 192907 1 through 5.

* cited by examiner

METHOD FOR PRODUCING A FERROELECTRIC LAYER OR AN ANTIFERROELECTRIC LAYER

FIELD

The present invention relates to a method for fabricating a ferroelectric layer or an antiferroelectric layer.

BACKGROUND

For the production of ferroelectric components such as memory transistors (FeFET, ferroelectric field-effect transistor), data storage capacitors (FRAM, ferroelectric random access memory), energy storage capacitors, pyroelectric sensors or harvesters, nonlinear filters and components with electro-optical functions, a functional ferroelectric layer only has to be produced separately to fulfill the corresponding functions. This fabrication requires separation of process steps such as masking, back etching, etc. to other components where ferroelectricity is undesirable. However, increasing process complexity due to dual integration, additional mask and process costs, and mutual influence of process steps complicate this goal. The laborious separation of the process sequences for the various components, which has been carried out up to now, is thus reflected in high production costs and increased process complexity.

SUMMARY

The present invention is therefore based on the object of proposing a method that avoids the disadvantages mentioned, i.e. with which a ferroelectric or antiferroelectric layer can be produced cost-efficiently, quickly and reliably.

This object is achieved according to the invention by a method according to the claims. Advantageous embodiments and further developments are described in the dependent claims.

In a method of forming a ferroelectric or antiferroelectric layer, a layer of a paraelectric material having a layer thickness of at least two crystallographic unit cells is deposited on a surface of a substrate. Subsequently, the substrate with the layer of paraelectric material is placed in an alternating electric field that is repeatedly cycled between a positive electric field strength and a negative electric field strength with an amplitude greater than the coercivity field strength of the material such that the layer of paraelectric material forms a polarization.

In the context of this document, a paraelectric material is to be understood in particular as a material, typically an electrically non-conductive metal, i.e. a material with an electrical conductivity of less than $10^{-8}$ S/m at a temperature of 25° C., which does not have any parallel-aligned permanent electric dipole moments. By forming a polarization, which can be present as remanent polarization or as spontaneous polarization, a ferroelectric state is generated by electrical cycles, i.e. a usually periodic field strength change as well as polarity change of the applied electric field, i.e. the layer of the paraelectric material becomes a ferroelectric layer. The electric field is thereby moved from a negative field strength to a value of positive field strength of the same amount and subsequently back to a negative field strength value at which the polarity of the electric field is changed. The amplitude here is greater than a value of the coercivity field strength of the material used. Typically, the positive amplitude and the negative amplitude are equal in amount, but it may be provided that the amount of the negative amplitude differs from the amount of the positive amplitude by more or less than 20 percent of the value of the positive amplitude.

By exposing a conventional dielectric such as the stably paraelectric material to a defined electric field, this originally paraelectric material can be transformed into the ferroelectric or antiferroelectric state, depending on the material or material configuration, for a certain time or permanently. Since ferroelectric properties are always accompanied by pyroelectricity, numerous pyroelectric applications can be developed. This transformation effect can achieve cost savings by eliminating the need for laborious dual integration of ferroelectric and paraelectric functions and, due to the elimination of lithography layers, an even tighter packing density of dielectric and (anti-)ferroelectric devices can be achieved. Here the ferroelectric behavior is adjusted, for example, by a dopant concentration and/or existing mechanical stresses in the layer. In addition, an in-plane field, i.e. an electric field running in the layer plane or parallel to it, can also help to achieve antiferroelectric behavior.

Through the continuous change from negative to positive polarity, in both cases an amplitude greater than the coercivity field strength of the material used is achieved, an (anti-)ferroelectric order is formed. A layer thickness of two crystallographic unit cells or more ensures that crystallization can occur. The size of the amplitude influences the general reaction rate of the crystallization. The polarization of the layer, and thus the ferroelectric order, typically increases linearly with time as the number of cycles increases.

Hafnium oxide, $HfO_2$, zirconium oxide, $ZrO_2$, or a mixed oxide of hafnium oxide and zirconium oxide, preferably $Hf_{0.5}Zr_{0.5}O_2$, can be used as the paraelectric material. The layer of paraelectric material can be deposited amorphously or semi-crystalline. It may be envisaged to provide the layer of paraelectric material, i.e. the paraelectric material with a dopant, i.e. to dope it. Preferably, silicon, Si, zirconium, Zr, but typically only if zirconium oxide is not already used as a material, lanthanum, La, yttrium, Y, aluminum, Al, gadolinium, Gd, and or strontium, Sr, is used as the dopant. This allows the properties of the layer to be adjusted more precisely.

In addition to the applied alternating electric field, thermal activation can occur by heating the layer of paraelectric material, which supports the formation of the (anti-)ferroelectric order. For this purpose, the layer is preferably heated to a temperature lower than the crystallization temperature of the paraelectric material. Temperature, like amplitude, affects the general reaction rate. Since when the crystallization temperature is reached, which in turn depends on the dopant, the paraelectric material crystallizes independently of an applied electric field, the temperature of the layer should remain below this temperature, preferably by at least 10° C., and particularly preferably by at least 20° C. It may also be envisaged that larger distances from the crystallization temperature are maintained, for example 30° C., 60° C. or 100° C., i.e. thermal activation is carried out at temperatures which are below the crystallization temperature by at least the values mentioned.

In contrast to thermal crystallization, where the temperature is significant and therefore shows a frequency dependence, for the described method the electric field potential is significant, which leads to ion transport and thus to polarization. Therefore, the crystallization temperature does not have to be reached or exceeded, but on the contrary, a difference from crystallization temperature should rather be maintained, since the polarization in the layer is formed by the polarization into a ferroelectric phase occurring as a consequence of ion transport, and not by thermal crystallization. Thus, the method described can also be carried out without thermal activation, provided that the temperature of the layer when the alternating electric field is applied is below the crystallization temperature of the paraelectric material by at least the values mentioned, preferably by at least 60° C.

It may also be envisaged that the method described is carried out without applying the layer of paraelectric material in a first step. In a method for producing a ferroelectric layer or an antiferroelectric layer, a layer of a paraelectric material already deposited on a surface of a substrate and having a layer thickness of at least two crystallographic unit cells is thus introduced into an alternating electric field which is repeatedly cycled between a positive electric field strength and a negative electric field strength having an amplitude greater than the coercivity field strength of the material used in such a way that the layer of the paraelectric material forms a polarization.

In this variant of the method, the previously described process steps can also be applied. In particular, the layer of the paraelectric material can already be amorphous or semi-crystalline, formed from the materials mentioned and/or provided with the dopants mentioned.

By means of this method alternative, various functions can be covered in an integrated system with one layer and, above all, can also be defined only after production or only in the application. This makes more flexible system concepts feasible: The actual function of a component or the actual functionality is defined only after completion of the manufacture of the component or during use.

A component according to the invention has a ferroelectric layer or antiferroelectric layer produced by a method having the features and properties described above.

The component is typically formed as a ferroelectric transistor, FeFET, a dynamic random access memory (DRAM), a ferroelectric random access memory (FRAM), a pyroelectric sensor, or an electrical capacitor.

DESCRIPTION OF THE FIGURES

Embodiments of the invention are shown in the drawings and are explained below with reference to FIGS. 1 to 5. Shown are.

DETAILED DESCRIPTION

Figure 1:
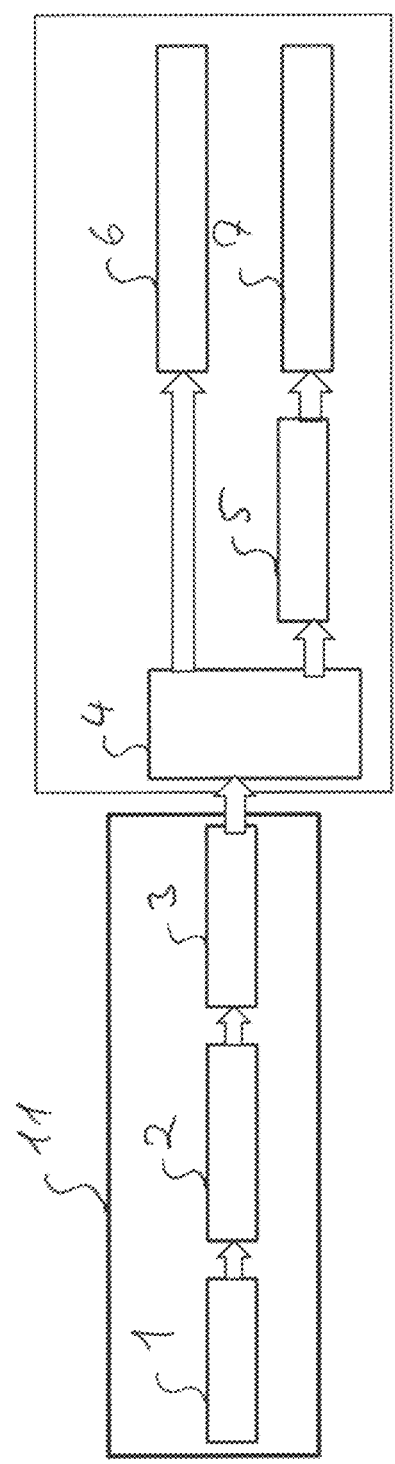
FIG. 1 a schematic flowchart for manufacturing and transforming a component.

FIG. 1 shows a schematic diagram of a method for producing a ferroelectric or antiferroelectric layer. In a first step 1, a preparation of a substrate to be coated is carried out, for example a cleaning of the substrate surface on which a paraelectric material is to be subsequently applied. In the second step 2, a dielectric, in the embodiment shown hafnium oxide, $HfO_2$, is deposited on this surface, which can be done by chemical or physical vapor deposition. For example, hafnium oxide doped with silicon and zirconium can be deposited on a 10 nm thick layer of titanium nitride, TiN, by atomic layer deposition, ALD, with a layer thickness of 5 nm to 10 nm. The substrate can be a p-doped silicon wafer on which the layer of TiN is deposited. To produce a capacitor, a 10 nm thick layer of TiN can then again be deposited on the hafnium oxide as the final layer. The layer thickness is greater than or equal to two crystallographic unit cells of the material used. The layer can be amorphous or semi-crystalline and can contain dopants such as silicon or lanthanum. Subsequently, further processing steps known from semiconductor technology, such as the application of a mask, can be carried out in a third step 3. Steps 1 to 3 thus form a production process 11, and functionalization is subsequently carried out in an application process 12.

Based on the component tested in step 4, a dielectric device 6 such as a CMOS (complementary metal-oxide-semiconductor) transistor can now be obtained either conventionally. Alternatively, in step 5, an electrical transformation is performed by exposing the component to an alternating electric field with an amplitude of field strength of, for example, 4.6 MV/cm. At this field strength, good polarization values for the mentioned layer thickness are already achieved within one second. However, the time shortens as the temperature increases. A maximum time period for exposure to the alternating electric field is thus one second. After the electric field is turned off, the layer of originally paraelectric material exhibits polarization, which may be remanent or spontaneous. The component is thus transformed and functionalized ferroelectrically, antiferroelectrically or pyroelectrically and is present as a corresponding ferroelectric, antiferroelectric or pyroelectric device 7, for example as an FeFET memory. In this case, it is not necessary to reach the crystallization temperature, since polarization is formed as a result of ion transport. On the contrary, it may even be advantageous if the layer of the paraelectric material has a maximum temperature when the alternating electric field is applied, which is typically at least 60° C. below the crystallization temperature of the paraelectric material.

The layer can be assisted in forming polarization by applying an electrical voltage or a mechanical voltage above a critical voltage, in the embodiment shown of 4.6 MV/cm.

In one variant, the method can also comprise only the application process 12, i.e. the component is already provided with paraelectric layer and is only functionalized in step 12.

The field strength of the alternating electric field is typically higher than an electric field strength applied to the finished component in the application. The transformation can be temporary or permanent and depends on the material configuration. Primarily, the effective activation energy is essential here, which correlates with the crystallization temperature, for example. This in turn depends on the dopant and its concentration. The conversion itself can take place during or after manufacture, and in particular only during the actually intended application.

Figure 2:
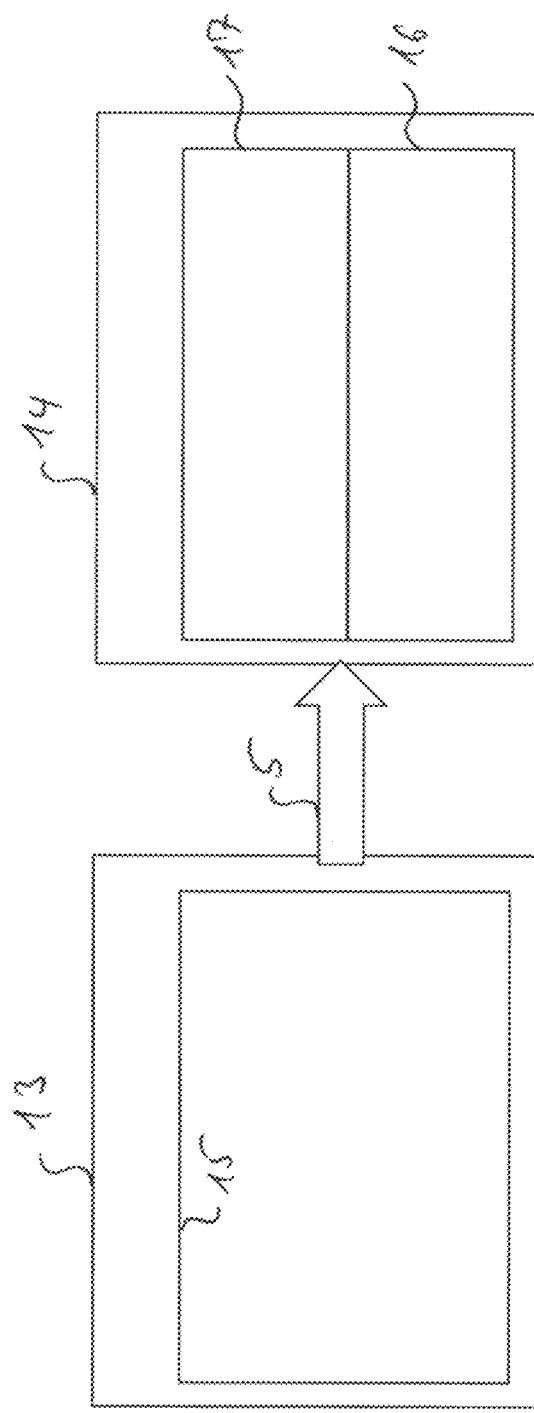
FIG. 2 a top view of a component with a partial transformation.

As shown in FIG. 2 in top view, the conversion or transformation can also be performed partially, almost arbitrarily scalable, so that an exact adjustment of the properties is possible. Recurring elements are provided with identical reference numerals in this Figure and also in the following figures. FIG. 2 shows a top view of a component 13, for example a chip, on the left side, which has a CMOS transistor area 15. The transformation step 5 results in a partial transformation if a suitable geometry is selected, in which a now reduced CMOS transistor region 16 remains on the functionalized component 14, while the region 17 exposed to the alternating electric field now has ferroelectric memory elements.

For this purpose, the transformation can also be accelerated thermally by increasing the temperature in addition to the electric field. For this purpose, the component with the layer of paraelectric material can be placed in a furnace or test chamber to keep the temperature rise low or to maintain the electrical voltage in a specified range at any time after fabrication by raising or changing the temperature. The crystallization temperature of hafnium zirconium oxide is about 350° C., the described process takes about 1 second at room temperature, but the time duration can be shortened if the temperature is increased.

Figure 3:
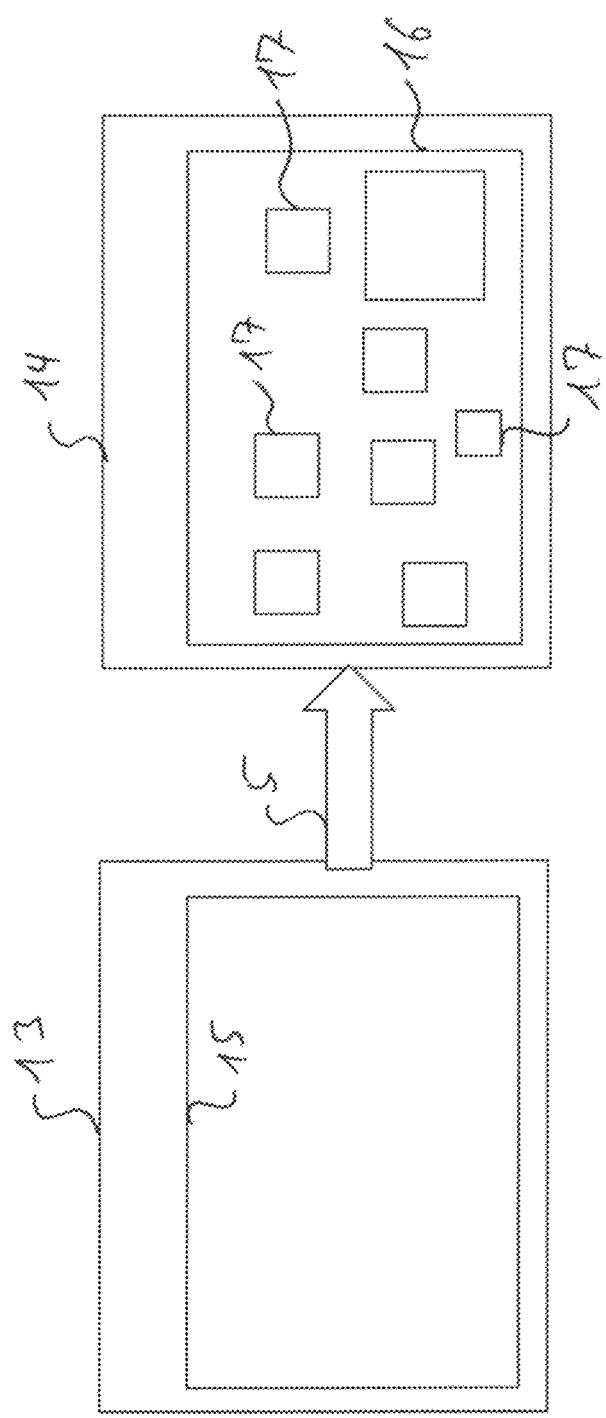
FIG. 3 a view of a selective transformation corresponding to FIG. 2.

FIG. 3 shows an example of a selective transformation in a view corresponding to FIG. 2. Beginning with device 13 and the CMOS transistor region, the transformation now forms selective ferroelectric regions 17 that remain in the downsized CMOS transistor region 16 of functionalized component 14.

Figure 4:
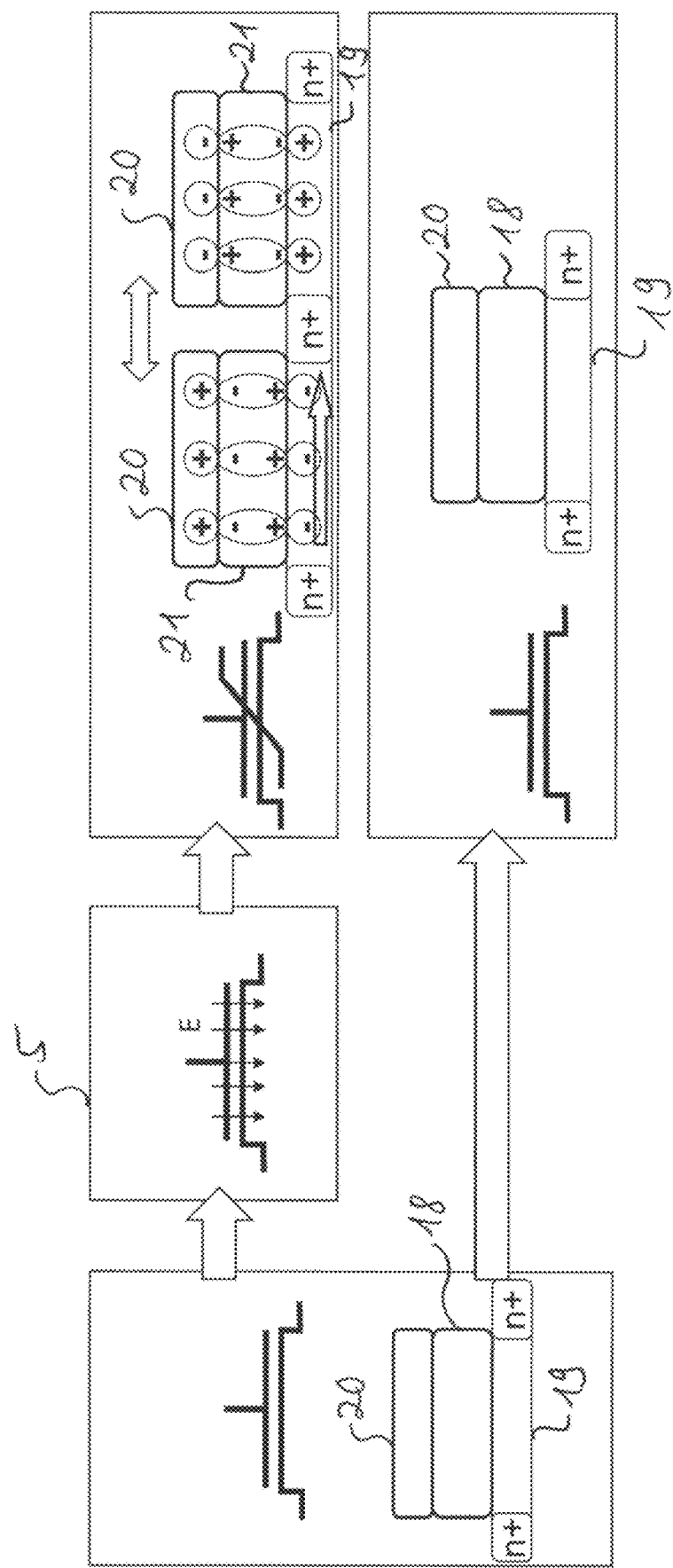
FIG. 4 a schematic flowchart for manufacturing a transistor.

FIG. 4 shows a schematic flowchart for the fabrication of an FeFET. The paraelectric layer 18 was deposited on the substrate 19 or an electrode layer arranged on the substrate, and an electrode layer 20 was applied and corresponding regions for producing a field-effect transistor were formed by doping in the substrate 19. As shown in the lower part, the field-effect transistor with the layer 18 as dielectric remains in this state, but alternatively, as reproduced in the upper part of the figure, it can be subjected to an electric field in transformation step 5, which in this case is caused by voltage pulses, i.e. is pulse-shaped. This results in a ferroelectric transistor, or FeFET, with a paraelectric layer 18 now transformed to a ferroelectric layer 21, which can be used as a switch and, as shown at the top right, can have different polarizations in different areas.

This method can be used especially in gate-load integration, where the potentially ferroelectric material is deposited after the gate anneal. The method allows for a high packing density of the components and no integrative differentiation during manufacturing. The differentiation of the function as memory, logic or analog transistor can be done after manufacturing or later in the application. The same applies to integration as a BEOL FEFET (back-end-of-line) with a ferroelectric capacitor in the BEOL, which is only functionalized by applying the electric field. This downstream functionalization allows a significant reduction in the thermal budget required to maintain the ferroelectric layer properties.

Figure 5:
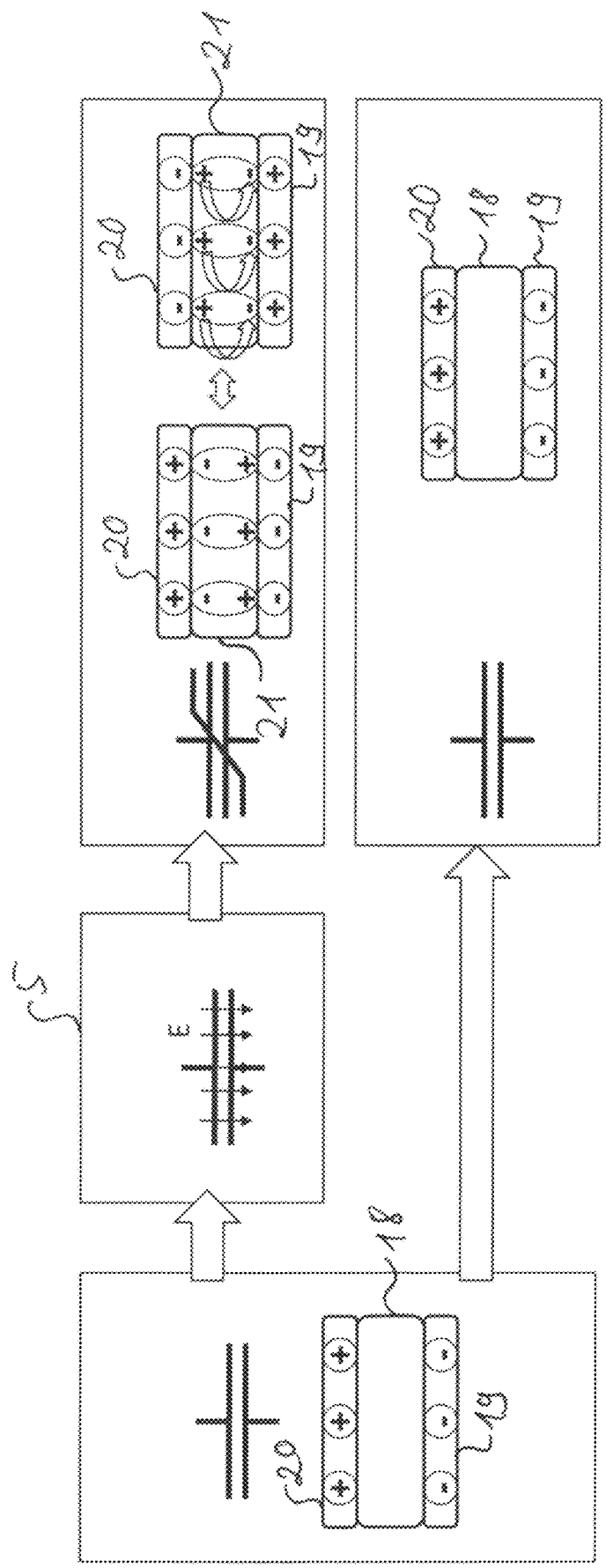
FIG. 5 a schematic flowchart for manufacturing an electrical capacitor.

As shown in FIG. 5 in a representation corresponding to FIG. 4, electrical capacitors or DRAM and FRAM memories can also be manufactured or functionalized using the method described. The layer 18 with the paraelectric material as dielectric is here arranged on the substrate 19 formed as electrode and serves as intermediate layer between the substrate 19 and the electrode layer 20. Without transformation step 5, it remains a conventional capacitor.

Transformation step 5 is again used to generate a switchable capacitor, which can form an energy storage device, for example. Integrated capacitors, as used in DRAM memory, can thus be subsequently configured ferroelectrically and thus nonvolatile as FRAM memory devices. According to the configuration, this allows the reliability (i.e., number of read and write cycles) and performance (i.e., read and write speed) characteristics, as well as non-volatility of the data, to be configured after the component is manufactured or during the application. This makes it possible to realize a DRAM/FRAM memory block with the same manufacturing steps and high packing density as with conventional manufacturing processes, which can be configured later as desired with regard to its functions.

The same applies to electrical capacitors, which are configurable in terms of linearity and polarization behavior. The ferroelectric configuration or transformation can also be partially, almost continuously adjusted in this process, so that the properties are scalable.

The field-induced crystallization described can also be applied to filter capacitors, for example high-pass filters, low-pass filters or signal filters. In addition, field-effect transistors can be configured as pyrosensors, which specifically exhibit ferroelectric and thus also pyroelectric properties as a result of the conversion and react sensitively to infrared radiation, for example. Finally, neuromorphic computers with synapses acting as memory elements and neurons acting as switching components can also be fabricated by the method described.

Since the transformation itself is not trivially detectable, circuits with obfuscated functions can also be realized, whereby also in this case the actual configuration can only take place during the application or runtime. The fuse serves as a kind of transport indicator.

Features of the different embodiments which are merely disclosed in the embodiment examples can be combined with one another and claimed individually.

The project that led to this application was funded by the ECSEL Joint Undertaking (JU) under Grant Agreement No. 783176. The JU receives support from the European Union's Horizon 2020 research and innovation program and from France, Germany, the Czech Republic, Spain and Turkey.

The invention claimed is:

1. A method of producing a ferroelectric layer or antiferroelectric layer, comprising:
   depositing an amorphous layer or semi-crystalline layer of a paraelectric material having a layer thickness of at least two crystallographic unit cells on a surface of a substrate,
   subsequently, the substrate with the layer of the paraelectric material is introduced into an alternating electric field which is moved repeatedly between a positive electric field strength and a negative electric field strength with an amplitude greater than the coercive field strength of the material in such a way that the layer of the paraelectric material forms a polarization,
   wherein the layer is still an amorphous layer or semi-crystalline layer when the substrate is introduced into the alternating electric field.

2. The method according to claim 1, wherein $HfO_2$, $ZrO_2$ is used as the paraelectric material.

3. The method according to claim 1, wherein $Hf_{0.5}Zr_{0.5}O_2$ is used as the paraelectric material.

4. The method according to claim 2, wherein the layer of the paraelectric material is deposited amorphously or partially crystalline.

5. The method according to claim 1, wherein the layer of paraelectric material is doped with a dopant selected from the group Si, Zr, La, Y, Al, Gd and Sr.

6. The method according to claim 1, wherein thermal activation is performed by heating the layer of the paraelectric material during application of the first alternating electric field.

7. The method according to claim 6, wherein the layer is heated to a temperature that is lower than the crystallization temperature of the paraelectric material.

8. The method according to claim 1, wherein when the alternating electric field is applied, a temperature of the layer is at least 60° C. below the crystallization temperature of the paraelectric material.

9. A component comprising a ferroelectric or antiferroelectric layer produced by the method according to claim 1.

10. The component according to claim 9, wherein the component is a ferroelectric transistor, FeFET, a DRAM memory, a FRAM memory, a pyroelectric sensor or an electrical capacitor.

11. A method of producing a ferroelectric layer or antiferroelectric layer in which an amorphous or semi-crystalline layer of a paraelectric material arranged on a surface of a substrate and having a layer thickness of at least two crystallographic unit cells is introduced, while the ferroelectric layer or antiferroelectric layer is still an amorphous layer or semi-crystalline layer, into an alternating electric field which is repeatedly cycled between a positive electric field strength and a negative electric field strength having an amplitude greater than the coercive field strength of the material such that the layer of the paraelectric material forms a polarization.

* * * * *